(12) United States Patent
Cargille

(10) Patent No.: US 6,552,604 B2
(45) Date of Patent: Apr. 22, 2003

(54) DIGITALLY TUNED ANALOG NOTCH FILTER CIRCUIT

(75) Inventor: Donald R. Cargille, Culver City, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/052,062

(22) Filed: Jan. 17, 2002

(65) Prior Publication Data

US 2002/0113644 A1 Aug. 22, 2002

Related U.S. Application Data

(60) Provisional application No. 60/269,561, filed on Feb. 16, 2001.

(51) Int. Cl.[7] .............................. H03B 1/00; H03K 5/00; H04B 1/00
(52) U.S. Cl. ........................................ 327/556; 327/552
(58) Field of Search .................................. 327/552–559

(56) References Cited

U.S. PATENT DOCUMENTS 6,404,279 B2 * 6/2002 Thomasson .................. 327/557

FOREIGN PATENT DOCUMENTS

GB 2019146 A * 10/1979 ............ H03H/7/02

* cited by examiner

Primary Examiner—Terry D. Cunningham
Assistant Examiner—Quan Tra
(74) Attorney, Agent, or Firm—Terje Gudmestad

(57) ABSTRACT

A notch filter circuit is provided including a first stage circuit and a second stage circuit. The first stage circuit sums a filter input signal with a filter output signal to form a summation signal. The second stage circuit includes a first tee network and a second tee network. The first tee network low-pass filters the filter input signal to form a first tee output signal. The second tee network high-pass filters the summation signal to form a second tee output signal. A first multiplying digital-to-analog converter is electrically coupled to the first tee network and the second tee network. The first converter modifies the gain of the second tee network in response to a gain signal to form a corrected second tee network signal, thereby adjusting a notch filter frequency.

20 Claims, 3 Drawing Sheets

DIGITALLY TUNED ANALOG NOTCH FILTER CIRCUIT

RELATED APPLICATION

The present invention is related to U.S. Provisional Application 60/269,561 entitled "Digitally Tuned Analog Notch Filter" filed on Feb. 16, 2001, that is incorporated by reference herein.

TECHNICAL FIELD

The present invention relates generally to filtering within a satellite communication system, and more particularly, to a method and apparatus for adjusting a notch filter frequency of a notch filter circuit within the satellite communication system.

BACKGROUND OF THE INVENTION

Notch filters are known in the art and are used in various applications including the areas of servomechanisms and communication. A notch filter has a magnitude characteristic value for frequencies near zero and the same value for frequencies approaching infinity that is high relative to a specified range of frequency values, where amplitude of the notch filter is low.

Two types of notch filters exist, digital notch filters and analog notch filters. Digital notch filters can be tuned at any time but are performance limited by sample rate speed and "throughput" limitations. Digital notch filters incorporate multiple analog-to-digital converters and require sampling of data. Therefore, analog notch filters are preferred over digital notch filters because of their simplicity and nonuse of sampling.

Traditionally, analog notch filters, hereinafter referred to as a notch filter, are tuned by varying and adjusting different resistors and capacitors to reach a desired notch filter frequency. The task of tuning a notch filter is tedious and time consuming. This task requires electronic unit disassembly, rework, and retest. Additionally, a notch filter frequency is not easily adjusted. Once a notch filter frequency is determined and the notch filter is constructed with the appropriate resistors and capacitors having appropriate values, the notch filter frequency is fixed and not adjustable without disassembly.

During pre-launch of a spacecraft multiple components are "tweaked" and modified up through the last minutes of preparation. When a notch filter frequency needs to be adjusted the notch filter is retuned as described above. The retuning potentially delays the launch and increases costs.

A typical notch filter has a first tee network on an input of the notch filter and a second tee network on a feedback path coupling an output of the notch filter to the input. Both the first tee network and the second tee network may consist of both resistors and capacitors. In order for the notch filter to operate appropriately the second tee network is required to impedance match the first tee network. The matching of the second tee network to the first tee network can be time consuming and become inconvenient especially during pre-launch of a spacecraft.

A notch filter having an adjustable notch filter frequency has been suggested by Steber and Krueger, "A Voltage-Controller Tunable Active Null Network" published in proceedings of IEEE vol. 57 pp. 233–234 February 1969. The notch filter in the Steber and Krueger reference inconveniently changes gain to different values above and below the notch filter frequency as the notch filter is tuned. For example, for a specified notch filter frequency the gain for low frequencies is substantially different from the gain for high frequencies. The inconsistent gain of the notch filter is undesirable in various electrical systems as known in the art. Also, in order for the notch filter of the Steber and Kruger reference to function properly a minimum of four integrated circuits are required. The larger the number of integrated circuits the larger the cost in production of and the heavier the notch filter. Available space on a spacecraft is limited and weight of the spacecraft is a critical factor in energy consumption during launch and maneuvering of the spacecraft. Therefore, minimization of integrated circuits is preferred.

It would therefore be desirable to develop a technique for adjusting a notch filter frequency without disassembly, reworking, and retesting of a notch filter. It would also be desirable for the developed notch filter to have uniform gain for both low and high frequencies while at the same time minimizing pre-launch preparation time, size, and weight of the notch filter.

SUMMARY OF THE INVENTION

The present invention provides a method and apparatus for adjusting a notch filter frequency of a notch filter circuit within a spacecraft. A notch filter circuit is provided including a first stage circuit and a second stage circuit. The first stage circuit has a first stage input and a first stage output terminal. The first stage circuit sums a filter input signal with a filter output signal to form a summation signal. The second stage circuit includes a first tee network and a second tee network. The first tee network is electrically coupled to the first stage input and low-pass filters the filter input signal to form a first tee output signal. The second tee network is electrically coupled to the first stage output terminal and high-pass filters the summation signal to form a second tee output signal. A first multiplying digital-to-analog converter is electrically coupled to the first tee network and the second tee network. The first multiplying digital-to-analog converter modifies the gain of the second tee network in response to a gain signal to form a corrected second tee network signal, thereby adjusting a notch filter frequency. The second stage circuit sums the first tee output signal with the corrected second tee output signal to form the filter output signal. A method for performing the same is also provided.

One of several advantages of the present invention is the elimination of a tee network within a feedback path of a notch filter. In so doing, the time required to match the feedback tee with an input tee is eliminated.

Another advantage of the present invention is the ability to adjust the notch filter frequency without disassembling the notch filter circuit, thereby, saving time involved in disassembly, reworking, and retesting of the notch filter circuit.

Furthermore, the present invention allows the notch filter frequency to be adjusted remotely and during launch or while in post-launch of a spacecraft. Thus, permitting adjustments to the notch filter frequency during events when adjustments would not normally be feasible.

The ability to adjust the notch filter frequency remotely also allows a single notch filter circuit to be used for potentially multiple purposes. The notch filter circuit may have a first notch filter frequency for a first application and a second notch filter frequency for a second application.

Other advantages and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
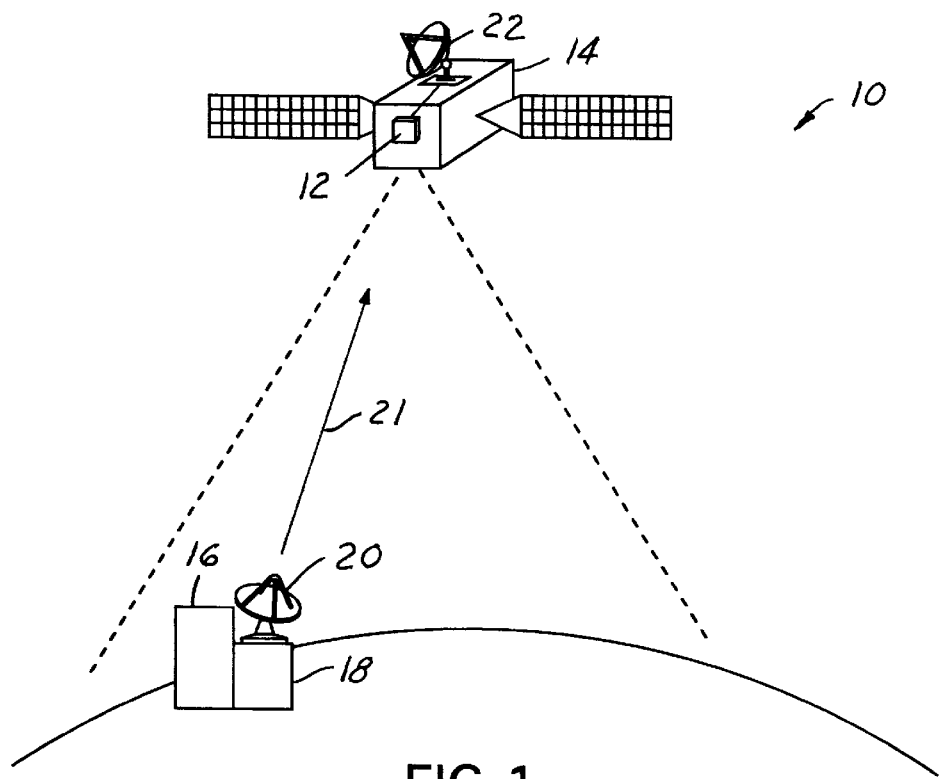
FIG. 1 is a perspective view of a system incorporating a notch filter circuit in accordance with an embodiment of the present invention.

In each of the following figures, the same reference numerals are used to refer to the same components. While the present invention is described with respect to a method and apparatus for adjusting a notch filter frequency of a notch filter circuit within a spacecraft, the present invention may be adapted to be used in various systems including: automotive vehicle systems, control systems, systems using servomechanisms, communication systems, or other systems utilizing a notch filter.

In the following description, various operating parameters and components are described for one constructed embodiment. These specific parameters and components are included as examples and are not meant to be limiting.

Referring now to FIG. 1, a perspective view of a system 10 incorporating a notch filter circuit 12 in accordance with an embodiment of the present invention, is shown. The system 10 includes a spacecraft 14 incorporating the use of the circuit 10 and an earth station 16. The earth station 16 includes a controller 18 and a first transceiver 20. The controller 18 determines a desired notch filter frequency and transmits a gain signal, represented by arrow 21, to a second transceiver 22, in response to the desired notch filter frequency. The second transceiver 22 is electrically coupled to the circuit 12. The circuit 12 adjusts the notch filter frequency in response to the gain signal 21.

The controller 18 is preferably microprocessor-based such as a computer having a central processing unit, memory (RAM and/or ROM), and associated input and output buses. The controller 18 may be a portion of a central main control unit or a stand-alone controller. The controller 18 may be located directly on the spacecraft 14 or at a remote location such as the earth station 16.

The first transceiver 20 and the second transceiver 22 are optional depending upon the application and may be of any type or style known in the art. Transceivers 20 and 22 may be simply a transmitter, a receiver, or a combination thereof. The transceiver 20 and 22 may also be integrally used within a separate system related or unrelated to the system 10.

Figure 2:
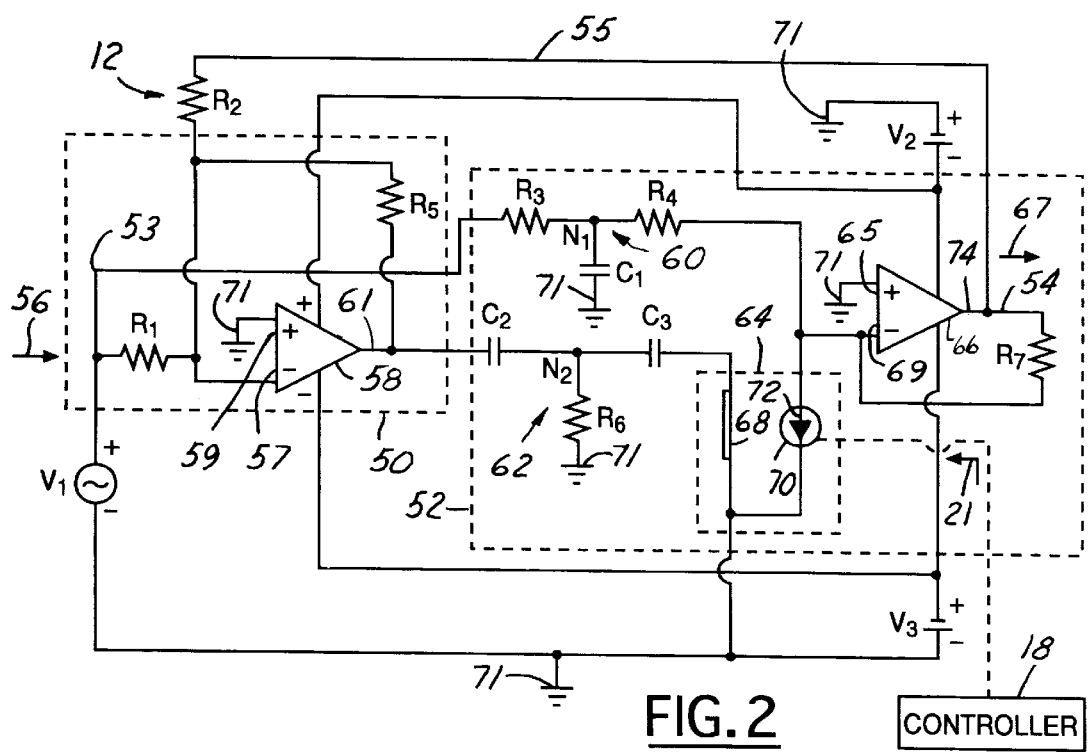
FIG. 2 is a schematic view of the notch filter circuit in accordance with an embodiment of the present invention.

Referring now to FIG. 2, a schematic diagram of the circuit 12 in accordance with an embodiment of the present invention, is shown. The circuit 12 is an analog device that includes a first stage circuit 50 and a second stage circuit 52 having a filter input 53 and a filter output 54. The second stage circuit 52 is electrically coupled to the first stage circuit 50 via a feedback path 55. The feedback path 55 provides notch filter performance stability. The first stage circuit 50 performs as a summer and an inverter. The second stage circuit 52 performs an additional two functions in that it combines low-pass filtering and high-pass filtering.

The first stage circuit 50 receives a filter input signal, represented by arrow 56, through a first resistor $R_1$, which is electrically coupled to the filter input and an inverting terminal 57 of a first inverting operational amplifier 58. The filter input signal 56 may be generated by a signal generator $V_1$ or from a different signal source known in the art. The amplifier 58 also has a non-inverting terminal 59 that is at ground potential, and a first stage output terminal 61. The first amplifier 58 has a feedback resister $R_5$ that is electrically coupled to terminals 57 and 63. $R_1$ and $R_5$ may be of equal resistance or of different resistance depending upon the application.

The second stage circuit 52 includes a first tee network 60 having a first node $N_1$, a second tee network 62 having a second node $N_2$, and a first multiplying digital-to-analog converter 64. A second inverting operational amplifier 66 is electrically coupled to the first tee networks 60 and the first converter 64. A non-inverting terminal 65 of the second amplifier 66 is also at ground potential. The second amplifier 66 has a feedback resistor $R_7$ electrically coupled to an inverting terminal 69 of the amplifier 66 and to a second stage output terminal 74 and generates a filter output signal, represented by arrow 67. The amplifiers 58 and 66 are electrically coupled to and receive power from power supplies $V_2$ and $V_3$, which are in turn electrically coupled to ground 71.

The first tee network 60 is electrically coupled to the filter input 53 and to the inverting terminal 69. The first tee network 60 performs as a low pass filter and consists of a third resistor $R_3$ and a fourth resistor $R_4$ as arms of the first tee network 60, and a first capacitor $C_1$ as a lower leg of the first tee network 60. $R_3$ is electrically coupled to the filter input 53 and to the node $N_1$. $R_4$ is electrically coupled to the node $N_1$ and to the inverting terminal 69. $C_1$ is electrically coupled to node $N_1$ and to ground 71. Resistors $R_3$ and $R_4$ have approximately equal resistance.

The second tee network 62 is electrically coupled to the first stage output terminal 61 and to the first converter 64, which in turn is electrically coupled to the inverting terminal 69. The second tee network 62 performs as a high pass filter and consists of a second capacitor $C_2$ and a third capacitor $C_3$ as arms of the second tee network 62, and a sixth resistor $R_6$ as a lower leg of the second tee network 62. $C_2$ is electrically coupled to the first stage output terminal 61 and to the second node $N_2$. $C_3$ is electrically coupled to the node $N_2$ and to the first converter 64. $R_6$ is electrically coupled to the node $N_2$ and to ground 71. Capacitors $C_1$, $C_2$, and $C_3$ have approximately equal capacitance.

The first converter 64 is a digitally programmable amplifier/attenuator that is electrically coupled to the transceiver 22. The first converter 64 receives the gain signal 21 from the controller 18, in a digital format, having a value between zero and one. First converter 64 senses the current passing through the second tee network 62, represented by sensor 68, and multiplies the gain of the second tee network 62 by the gain signal 21. The adjustment of the gain is represented by the current supply 70. The current supply 70 has an arrow 72 pointing in the opposite direct of current flow through the second tee network 62. The arrow 72 is in the opposite direction of current flow since the first converter 64 either attenuates the amount of current flow or holds the amount of current flow constant. In multiplying the gain of the second tee network 62 by the gain signal 21 a second tee output signal is attenuated to form a corrected second tee output signal, thereby altering the notch filter frequency. An example of a first converter 64 that may be used is a converter by ANALOG DEVICES, model number AN-137.

The feedback path 55 is electrically coupled to the second stage output terminal 74 and to the first stage input 53. The feedback path 55 consists of a second resistor $R_2$, which has approximately equal resistance as resistor $R_1$. The equivalence of resistors $R_1$ and $R_2$ allow the filter output signal 67 to be summed to the filter input signal 56 and thereby, exciting the second tee network 62. Impedance matching $R_1$ and $R_2$ is an easier task than that of matching a first resistor capacitor (RC) tee network of a feedback path to a second RC tee network of a notch filter input, as may be required with a traditional notch filter.

Note that all resistors and capacitors may have various resistance and capacitance values depending upon the application and a desired notch filter frequency operable range. Also as shown, the circuit 12 has only three integrated circuits (ICs), the operational amplifiers 58 and 66 and the first converter 64. As known in the art, the first converter 64 may require the use of an additional operational amplifier to operate appropriately depending upon the application.

Figure 3:
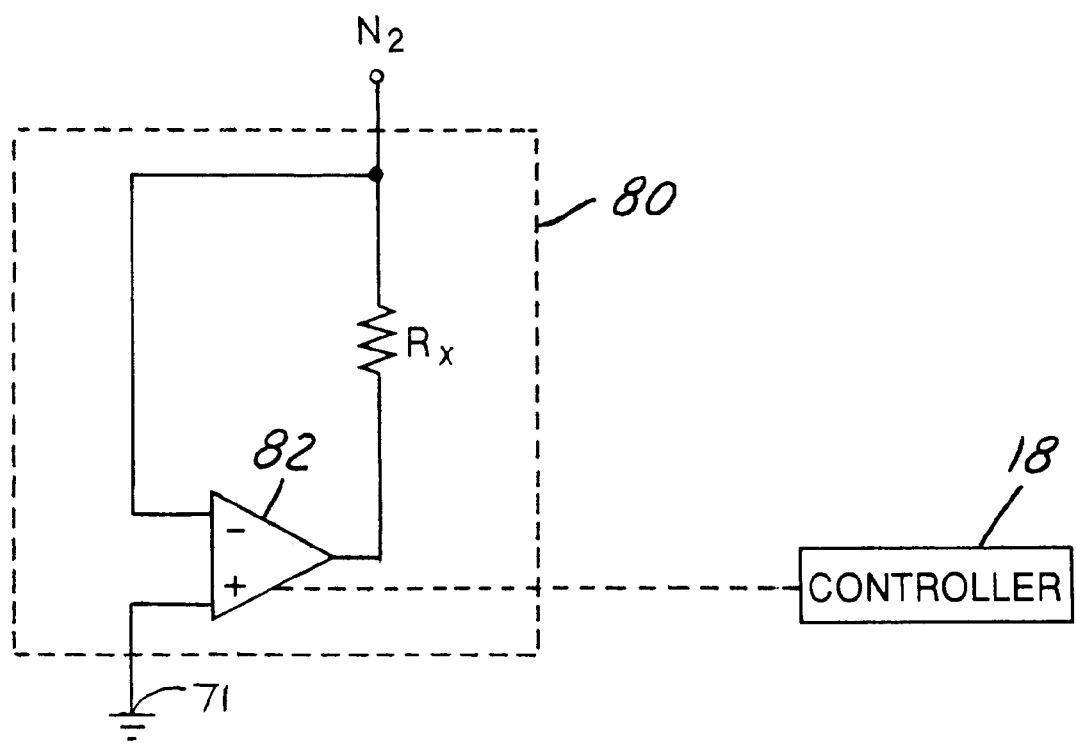
FIG. 3 is a schematic view of a notch filter notch depth adjustment circuit in accordance with another embodiment of the present invention.

Referring now also to FIG. 3, a schematic view of a notch filter notch depth adjustment circuit 80 in accordance with another embodiment of the present invention, is shown. A low notch gain for the notch filter circuit 12 is desired. Low gain or approximately zero gain is difficult to maintain over the notch filter frequency tuning range. So to maintain approximately zero gain, $R_6$ may be replaced with the notch depth adjustment circuit 80. Node $N_2$ is electrically coupled to a range resistor Rx, which is electrically coupled to a second converter 82. The second converter 82 is also electrically coupled to the node $N_2$, ground 71, and to the controller 18.

The second converter 82 is a digitally programmable amplifier/attenuator similar to the first converter 64. But unlike the converter 64 that adjusts current gain, the second converter 82 adjusts voltage gain. The second converter 82 receives a resistance adjustment signal from the controller 18, in a digital format, having a value B between zero and slightly less than one. The second converter 82 in response to the resistance adjustment signal alters the resistance of the adjustment circuit 80 to be the value of range resistor Rx divided by the difference, one minus B. The resistance of the adjustment circuit may thereby be adjusted for the lowest possible gain at the notch filter frequency. The second converter 82 may also be an ANALOG DEVICES, model number AN-137 converter or other multiplying digital to analog converter known in the art.

Figure 4:
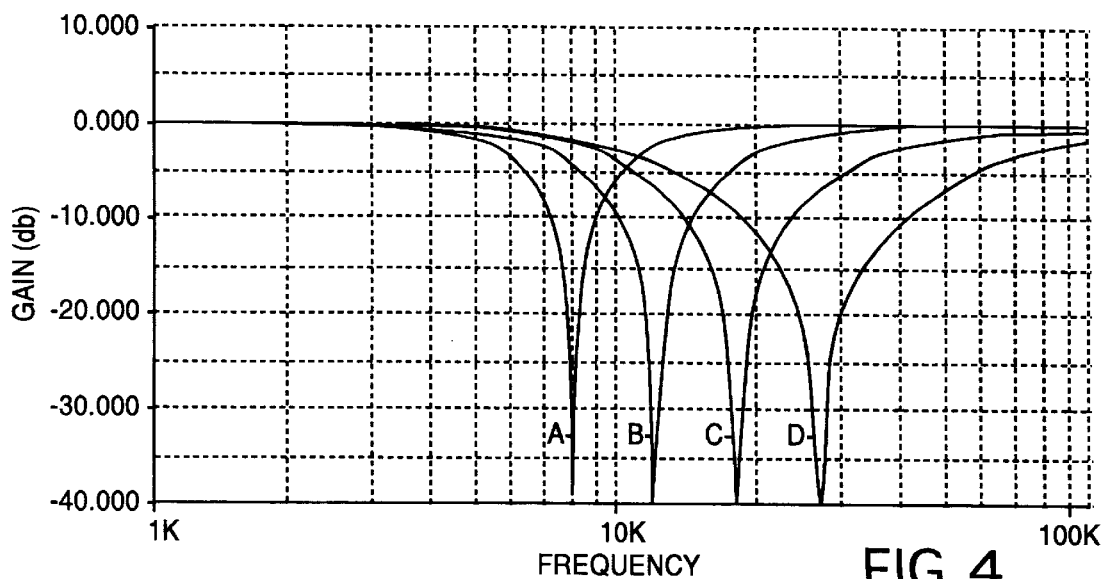
FIG. 4 is a plot of gain versus frequency level for the notch filter circuit in accordance with an embodiment of the present.

Referring now to FIG. 4, a plot of gain versus frequency level for the circuit 12 in accordance with an embodiment of the present, is shown. The gain for low frequencies is approximately equal to the gain for high frequencies or in other words there is unity gain for both low and high frequencies. Curves A, B, C, and D illustrate gain variance increasing from approximately 0.088 to 1.0. Curve A represents a gain value of approximately 0.088 and a notch filter frequency value of approximately 8 KHz. Curve D represents a gain value of approximately 1.0 and a notch filter frequency value of approximately 28 KHz. The first converter 64 may be adjusted to have a gain factor equal to any value from 0.088 to 1.0 to tune the notch filter frequency to any value from 8 to 28 KHz. Curves B and C are examples of notch tunings within this range. The curves A, B, C, and D are the result of a constructed example of a notch filter, of the present invention, having the following values for $R_1$, $R_2$, $R_3$, $R_4$, $R_5$, $R_6$, $R_7$, $C_1$, $C_2$, and $C_3$ 20K:, 20K:, 12.7K:, 12.7K:, 20K:, 3.2K:, 25.4K:, 2.2nf, 2.2nf, respectively.

Figure 5:
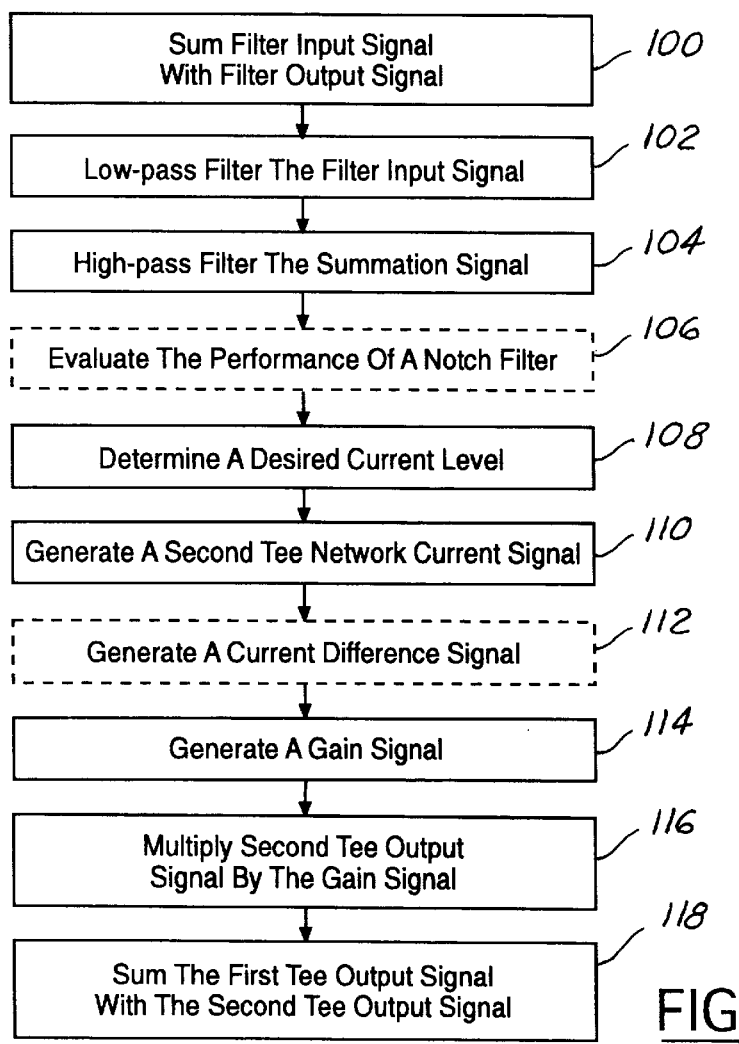
FIG. 5 is a logic flow diagram illustrating a method of adjusting notch filter frequency of the notch filter circuit according to an embodiment of the present invention.

Referring now to FIG. 5, a logic flow diagram illustrating a method of adjusting notch filter frequency of the circuit 12 according to an embodiment of the present invention, is shown.

In step 100, the first stage circuit 50 sums the filter input signal 56 with the filter output signal 67 to form a summation signal.

In step 102, the first tee network 60 low-pass filters the filter input signal 56 to form the first tee output signal 67.

In step 104, the second tee network 62 high-pass filters the summation signal to form the second tee output signal.

In step 106, the controller 18 may evaluate the performance of the circuit 12 and generate an evaluation signal. In evaluating the performance of the circuit 12 the controller 18 monitors any of the following: a notch filter frequency, a notch filter bandwidth, gain for low frequencies, gain for high frequencies, accuracy of filter cut-off frequencies, or other notch filter characteristics known in the art.

In step 108, the controller 18 determines a desired current level for the second tee network 62. The desired current level corresponds to a particular task or application. The desired current level may be determined in response to the evaluation signal.

In step 110, the first converter 64 determines current level of the second tee network 62 and generates a second tee network current signal.

In step 112, the controller 18 may generate a current difference signal in response to the desired current level and the second tee network current level.

In step 114, the controller 18 generates the gain signal 21 indirectly in response to the current difference signal or directly in response to the second tee network current signal. The gain signal 21 is transmitted to the first converter 64 in a digital format.

In step 116, the first converter 64 multiplies the second tee output signal by the gain signal 21 to form the corrected second tee output signal. Thus, adjusting the notch filter frequency to a desired notch filter frequency.

In step 118, the second amplifier 66 sums the first tee output signal with the corrected second tee output signal to form the filter output signal 67.

The above-described steps are meant to be an illustrative example, the steps may be performed synchronously or in a different order depending upon the application.

The present invention therefore provides a notch filter circuit with an adjustable notch filter frequency. The notch filter frequency is adjustable without disassembly, reworking, or retesting of the notch filter circuit and may be adjusted remotely. The notch filter frequency may be adjusted onboard a vehicle or at a remote station. The notch filter circuit of the present invention also allows for easy impedance matching by minimizing resistor capacitor tee networks. Moreover, the present invention minimizing the amount of required integrated circuits to minimize costs of production and weight of the notch filter circuit.

The above-described apparatus, to one skilled in the art, is capable of being adapted for various purposes and is not limited to the following systems: automotive vehicle systems, control systems, systems using servomechanisms, communication systems, or other systems utilizing a notch filter. The above-described invention may also be varied without deviating from the spirit and scope of the invention as contemplated by the following claims.

What is claimed is:

1. A notch filter circuit comprising:
a first stage circuit comprising a first stage input and a first stage output terminal, said first stage circuit summing a filter input signal with a filter output signal to form a summation signal; and
a second stage circuit having a second stage output terminal and comprising; a first tee network electrically coupled to said first stage input and low-pass filtering said filter input signal to form a first tee output signal;
a second tee network electrically coupled to said first stage output terminal and high-pass filtering said summation signal to form a second tee output signal; and
a first multiplying digital-to-analog converter electrically coupled to said first tee network and said second tee network, said first multiplying digital-to-analog converter modifying gain of said second tee network in response to a gain signal to form a corrected second tee network signal;
said second stage circuit summing said first tee output signal with said corrected second tee output signal to form said filter output signal.

2. A circuit as in claim 1 further comprising a non-Tee style feedback path electrically coupling said second stage output terminal to said first stage input.

3. A circuit as in claim 2 wherein:
said first stage circuit comprising a first resistor having a first resistance; and
said non-Tee style feedback path comprising a second resistor having a second resistance approximately equal to said first resistance.

4. A circuit as in claim 1 wherein said first tee network comprises:
a third resistor having a third resistance; and
a fourth resistor having a fourth resistance approximately equal to said third resistance.

5. A circuit as in claim 1 further comprising:
a notch filter notch depth adjustment circuit comprising;
a range resistor electrically coupled to said second stage circuit; and
a second multiplying digital-to-analog converter electrically coupled to said range resistor;
said second multiplying digital-to-analog converter adjusting resistance of said notch filter notch depth circuit in response to a resistance adjustment signal.

6. A circuit as in claim 1 wherein said second tee network comprises:
a first capacitor having a first capacitance; and
a second capacitor having a second capacitance approximately equal to said first capacitance.

7. A circuit as in claim 6 wherein said first tee network comprises a third capacitor having a third capacitance approximately equal to said first capacitance.

8. A circuit as in claim 1 wherein said first stage circuit comprises a first operational amplifier electrically coupled to said first stage input and said first stage output terminal, said first operational amplifier sums said filter input signal with said filter output signal to form said summation signal.

9. A circuit as in claim 1 wherein said second stage circuit comprises a second operational amplifier electrically coupled to said first tee network, said second tee network, and said first stage input, said second operational amplifier sums signal outputs of said first tee network and said second tee network to form said filter output signal.

10. A circuit as in claim 1 wherein the circuit has approximately equal gain for both low frequencies and high frequencies.

11. A circuit as in claim 1 wherein the circuit has unitary gain for both low and high frequencies.

12. A system comprising:
a controller generating a gain signal; and
a notch filter circuit comprising:
a first stage circuit comprising a first stage input and a first stage output terminal, said first stage circuit summing a filter input signal with a filter output signal to form a summation signal; and
a second stage circuit having a second stage output terminal comprising;
a first tee network electrically coupled to said first stage input and low-pass filtering said filter input signal to form a first tee output signal;
a second tee network electrically coupled to said first stage output terminal and high-pass filtering said summation signal to form a second tee output signal; and
a first multiplying digital-to-analog converter electrically coupled to said controller, said first tee network, and said second tee network, said first multiplying digital-to-analog converter modifying gain of said second tee network in response to said gain signal to form a corrected second tee network signal;
said second stage circuit summing said first tee output signal with said corrected second tee output signal to form said filter output signal.

13. A system as in claim 12 further comprising:
a first transceiver electrically coupled to said controller and transmitting said gain signal;
a second transceiver electrically coupled to said first multiplying digital-to-analog converter and receiving said gain signal.

14. A system as in claim 12 wherein:
said controller evaluates a characteristic of said notch filter circuit and generates an evaluation signal; and
said controller in response to said evaluation signal generates said gain signal.

15. A system as in claim 12 wherein:
said first multiplying digital-to-analog converter determines current level of said second tee output signal and generates a second tee current signal;
said controller compares said second tee current signal with a desired current signal and generates a current difference signal; and
said controller in response to said current difference signal generates said gain signal.

16. A system as in claim 12 further comprising a non-Tee style feedback path electrically coupling said second stage output terminal to said first stage input.

17. A system as in claim 16 wherein:
said first stage circuit comprising a first resistor having a first resistance; and
said non-Tee style feedback path comprising a second resistor having a second resistance approximately equal to said first resistance.

18. A method of adjusting notch filter frequency of a notch filter circuit comprising:
summing a filter input signal with a filter output signal to form a summation signal;
low-pass filtering said filter input signal via a first tee network to form a first tee output signal;

high-pass filtering said summation signal via a second tee network to form a second tee output signal;

modifying gain of said second tee network in response to a gain signal to form a corrected second tee output signal; and summing said first tee output signal with said corrected second tee output signal to form said filter output signal.

19. A method as in claim 18 further comprising:

evaluating the performance of the notch filter circuit and generating an evaluation signal;

generating said gain signal in response to said evaluation signal;

determining a second tee network current level and generating a second tee network current signal; and multiplying a second tee output signal by said gain signal in response to said second tee network current signal to adjust the notch filter frequency.

20. A system as in claim 18 further comprising:

determining a desired current level for said second tee network;

determining a second tee network current level;

generating a current difference signal in response to said desired current level and said second tee network current level;

generating said gain signal in response to said current difference signal; and multiplying said second tee output signal by said gain signal to adjust the notch filter frequency.

* * * * *